United States Patent [19]
Kimura et al.

[11] Patent Number: 5,572,163
[45] Date of Patent: Nov. 5, 1996

[54] ACTIVE FILTER CONTROL APPARATUS

[75] Inventors: Hiroshi Kimura, Takasaki; Ryutaro Horita, Yokohama; Kenichi Hase, Yokohama; Kunio Watanabe, Yokohama; Takashi Nara, Takasaki, all of Japan

[73] Assignee: Hitachi, Ltd., Tokyo, Japan

[21] Appl. No.: 362,874

[22] Filed: Dec. 23, 1994

[30] Foreign Application Priority Data

Dec. 28, 1993 [JP] Japan ................................. 5-334601

[51] Int. Cl.[6] ............................... H03B 5/00; H03H 11/04
[52] U.S. Cl. .......................... 327/553; 327/551; 327/552; 330/305; 360/65; 360/46
[58] Field of Search .................................. 327/551, 552, 327/553, 554, 555, 556, 557, 558; 360/46, 65, 51; 330/303, 305, 306, 107; 369/50, 124

[56] References Cited

U.S. PATENT DOCUMENTS

| | | | |
|---|---|---|---|
| 5,117,205 | 5/1992 | Nauta | 327/553 |
| 5,200,716 | 4/1993 | Amano | 327/553 |
| 5,270,875 | 12/1993 | Shah et al. | 360/46 |
| 5,432,562 | 7/1995 | Van De Waterlaat et al. | 348/613 |
| 5,440,264 | 8/1995 | Sevenhans et al. | 327/552 |

OTHER PUBLICATIONS

Vierman, "Design of a Bipolar 10–MHz Programmable Continuous–Time 0.05° Equiripple Linear Phase Filter," IEEE Journal of Solid–State Circuits, vol. 27, No. 3, Mar., 1992, pp. 324–331.

Primary Examiner—Timothy P. Callahan
Assistant Examiner—Dinh T. Le
Attorney, Agent, or Firm—Antonelli, Terry, Stout & Kraus

[57] ABSTRACT

An active filter control apparatus for controlling or tuning an active filter having a variable cut-off frequency. The active filter control apparatus includes a control circuit for controlling or tuning the cut-off frequency of the active filter and a characteristic correction generator for generating a correction signal to correct a group delay characteristic of the active filter in accordance with a set cut-off frequency. The characteristic correction includes a correction signal generator for generating the correction signal in accordance with a set correction amount. The cut-off frequency controller controls tunes the characteristic of the active filter in accordance with the correction signal. Preferably, the apparatus is formed of a one-chip LSI integrated on one chip. The control apparatus can be utilized to control the speed in a recording/reproducing apparatus such as a optical disk drive or a magnetic tape drive apparatus.

12 Claims, 13 Drawing Sheets

FIG. 5

REGISTER SETTING TABLE

| ZONE NUMBER | REGISTER 2 | fc [MHz] | REGISTER 3 (REGISTER 4) |
|---|---|---|---|
| ZONE 1 | 00 ... 000 | 5.000 | 0 ... 00 |
| ZONE 2 | 00 ... 001 | 6.000 | 0 ... 00 |
| ZONE 3 | 00 ... 010 | 7.000 | 0 ... 00 |
| ..... | ..... | ..... | ..... |
| ZONE (n-2) | 11 ... 101 | 28.00 | 1 ... 01 |
| ZONE (n-1) | 11 ... 110 | 29.00 | 1 ... 10 |
| ZONE n | 11 ... 111 | 30.00 | 1 ... 11 |

INNER — OUTER

LOW FREQUENCY — HIGH FREQUENCY

LINEAR RECORDING DENSITY: INNER>OUTER

CDR METHOD

LINEAR RECORDING DENSITY: CONSTANT

FILTER
CUT-OFF
FREQUENCY
RESPONSE

FIXED CUT-OFF FREQUENCY

VARRIABLE CUT-OFF
VARRIABLE FREQUENCY

ACTIVE FILTER CONTROL APPARATUS

BACKGROUND OF THE INVENTION

1. Field of the Invention

The present invention relates to a magnetic disk drive apparatus, an optical disk drive apparatus, a magnetic tape drive apparatus, or the like apparatus and more particularly, to an active filter control apparatus which performs optimum waveform equalization of a read-out waveform in a signal processor of a system having different data transfer rates, e.g., at the inner and outer peripheries of a disk.

2. Description of the Related Art

A constant density recording (hereinafter simply referred to as CDR) method has been devised as a method for increasing the recording capacity of a magnetic disk. When the CDR method is adopted, the rate of transferring data between the disk and a signal processing unit changes, and therefore an active filter whose filter characteristic is variable with the transfer rate is employed as a filter for processing a read-out waveform. Sympathetically with the tendency towards increasing the capacity of the magnetic disk, the data transfer rate tends to increase and a highly accurate active filter operable to a high frequency band is sought. Further, with a system using the a magnetic disk drive apparatus, such as a personal computer, a reduction in operation voltage and power necessitates reduction in operation voltage and power consumption of the magnetic disk drive apparatus, and so the active filter is also required to perform with reduced in operation voltage and power consumption.

A conventional active filter control apparatus will be described with reference to FIG. 1.

FIG. 1 is a block diagram schematically showing the conventional active filter control apparatus. The apparatus comprises a microprocessor 1 and an active filter block 100 which includes a register 2, a digital to analog converter (hereinafter referred to as DAC) 5, a transconductance control current generator (hereinafter simply referred to as Gm control current generator) 8, an active filter 9 and a reference current source 10. The active filter 9 includes transconductance amplifiers (hereinafter simply referred to as Gm amplifiers) 11 and 12 and capacitors 13 and 14.

When the active filter control apparatus is used in the magnetic disk drive apparatus, the microprocessor 1 sets a value in the register 2 in accordance with a data transfer rate, and the DAC 5 receives a reference current iref from the reference current source 10 and delivers a cut-off frequency control current ifc complying with the set value of the register 2. The Gm control current generator 8 receives the cut-off frequency control current ifc and delivers transconductance control currents igm1 and igm2 which are proportional to the input control current ifc. The ratio between the transconductance control currents igm1 and igm2 is determined by a characteristic of the active filter 9. Conductance of the Gm amplifiers 11 and 12 in the active filter 9 is controlled using the transconductance control currents igm1 and igm2 to control the filter characteristic of the active filter 9.

The active filter control apparatus as above is described in, for example, IEEE JOURNAL OF SOLID-STATE CIRCUITS, VOL.27, NO.3, MARCH 1992, "Design of a Bipolar 10-MHz Programmable Continuous-Time 0.05° Equiripple Linear Phase Filter".

The filter characteristic of the prior art active filter will be described.

FIG. 2 is a graph showing the relation between the set value of the cut-off frequency setting register and the cut-off frequency (fc) in the prior art active filter. The dotted line represents the characteristic of an ideal active filter, and the solid line represents the characteristic of a real circuit. While in a low cut-off frequency band the ideal characteristic coincides with the characteristic of the real circuit, the cut-off frequency in the real circuit decreases below that of the ideal characteristic in a high cut-off frequency band, and linearity is lost. This is because the pole existing parasitically in the Gm amplifiers constituting the active filter has less effect on the cut-off frequency of the active filter in the low frequency band than in the high frequency band.

FIG. 3 is a graph showing the relation between the cut-off frequency and Q in the active filter. The dotted line represents the ideal characteristic, and the solid line represents the characteristic of the real circuit. The Q of filter ideally remains constant even when the cut-off frequency changes, but in the real circuit, when the cut-off frequency is increased, the phase rotation is increased under the influence of the pole in the Gm amplifiers and Q becomes large.

SUMMARY OF THE INVENTION

As shown in FIGS. 2 and 3, when a high cut-off frequency is desired to be set, the cut-off frequency and Q of the active filter deviate from ideal values, and consequently the group delay characteristic (obtained by differentiating the phase by the frequency) also shifts from an ideal value.

Especially, in the magnetic disk drive apparatus, deterioration in the group delay characteristic brings about waveform distortion which is a significant problem.

Some circuitry can improve the characteristics of the Gm amplifiers per se constituting the active filter, but such circuitry has difficulties in meeting the reduction in operation voltage.

An object of the present invention is to realize an active filter control apparatus which can suppress deterioration in the filter characteristic when a high cut-off frequency is desired to be set and which can meet the reduction in operation voltage.

Another object of the present invention is to provide a magnetic disk drive apparatus based on the CDR method which can suppress the error rate and reduce power consumption by using the above active filter control apparatus.

Still another object of the present invention is to provide an active filter LSI which can reduce the operation voltage by incorporating the above active filter control apparatus.

To accomplish the above objects, according to the present invention, a correction unit is provided which corrects a signal for controlling or tuning the characteristic of the active filter.

More specifically, a correction unit is provided which corrects or tunes an active filter characteristic control signal in accordance with a preset correction amount.

Further, there are provided a slave active filter, a correction signal generator unit for comparing amplitudes of input and output of the active filter at a set cut-off frequency and generating a correction signal for correcting a difference, and a current generator responsive to the correction signal to control the characteristic of a master active filter.

Further, there are provided a slave active filter, a correction signal generator unit for comparing phases of input and output of the active filter at a set cut-off frequency and generating a correction signal for correcting a difference, and a current generator responsive to the correction signal to control or tune the characteristic of a master active filter.

As described above, the Gm amplifiers per se are not changed and hence an active filter block operative at a low power supply voltage can be constructed. As a result, a signal processing block in the magnetic disk drive apparatus can easily be realized with one chip LSI.

Further, even when the active filter is constructed of Gm amplifiers of low power supply voltage and low power consumption, correction can be ensured to make ideal the characteristic of the active filter in a high cut-off frequency band. As a result, in a magnetic disk drive apparatus of high recording density based on the CDR method, a high data transfer rate can be ensured.

For the above reasons, a magnetic disk drive apparatus of low power consumption and high recording density can be constructed.

The above and other objects and advantages of the present invention can be more fully understood from the following description taken in conjunction with the accompanying drawings.

BRIEF DESCRIPTION OF THE DRAWINGS

FIG. 5 shows a register setting table for the active filter in the FIG. 4 embodiment.

DESCRIPTION OF THE PREFERRED EMBODIMENTS

Figure 1:
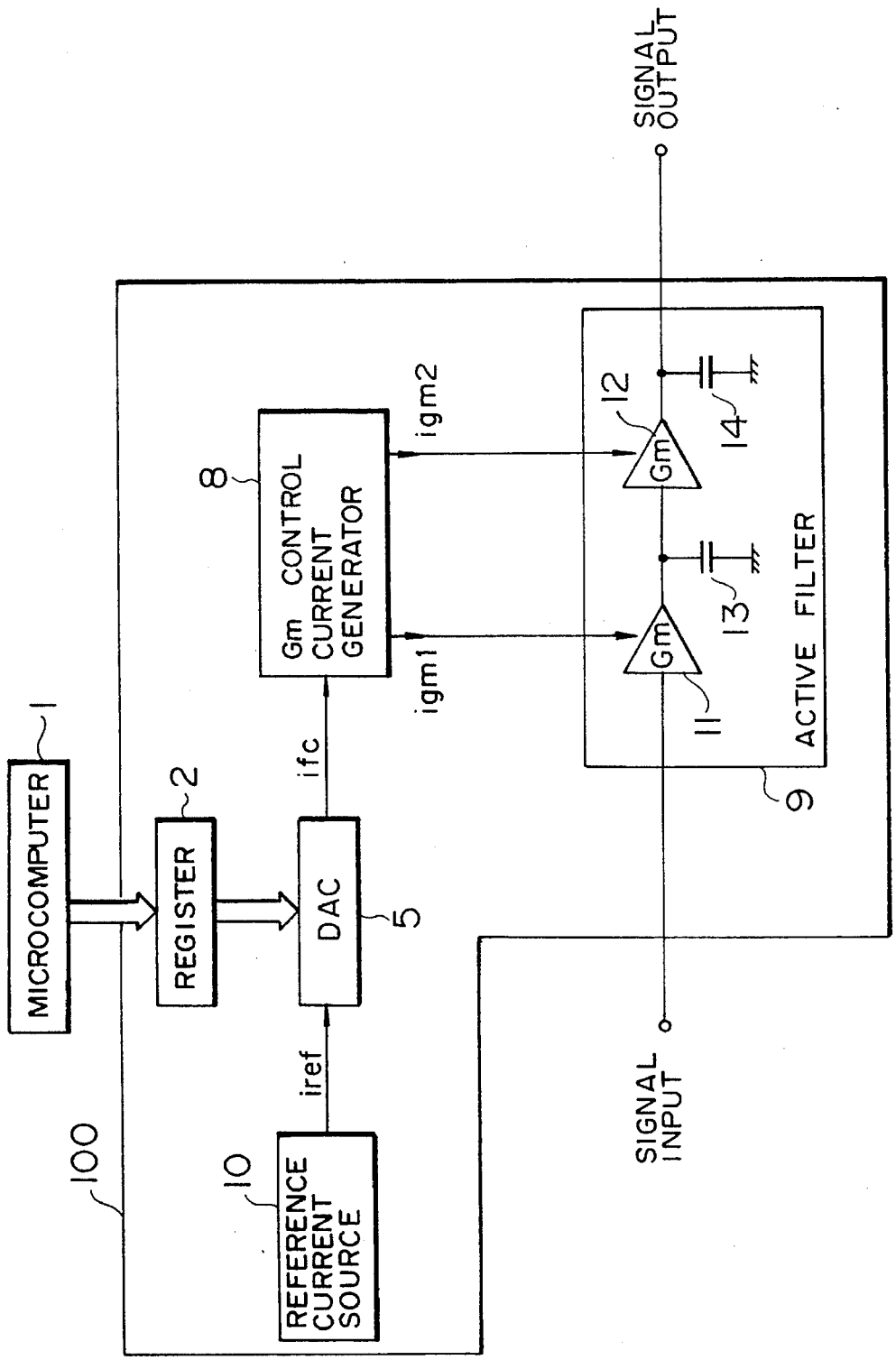
FIG. 1 is a block diagram showing the construction of a conventional active filter.
Figure 2:
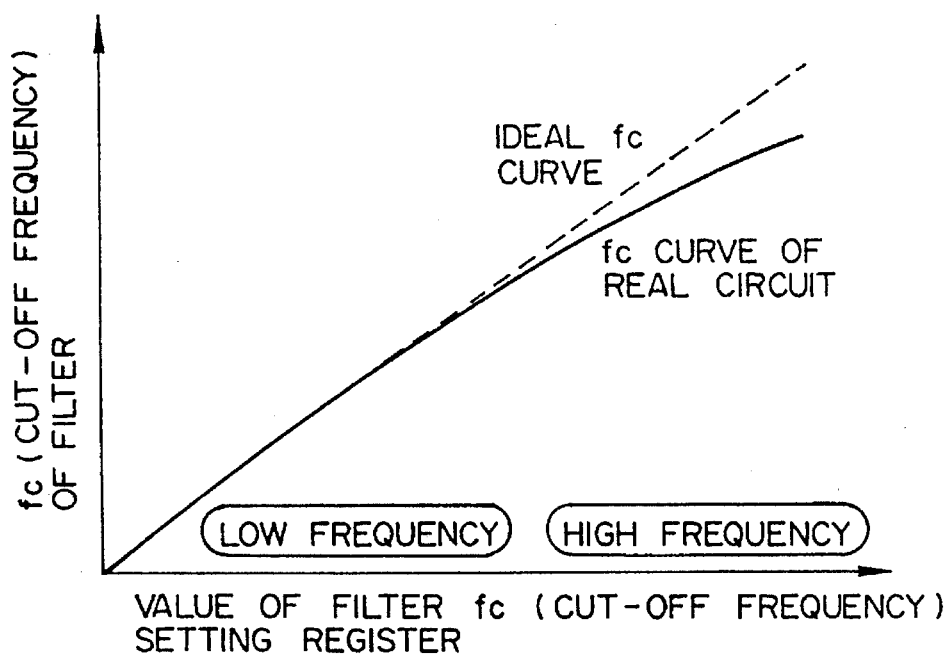
FIG. 2 is a graph showing the relation between cut-off frequency and register setting value in the conventional active filter.
Figure 3:
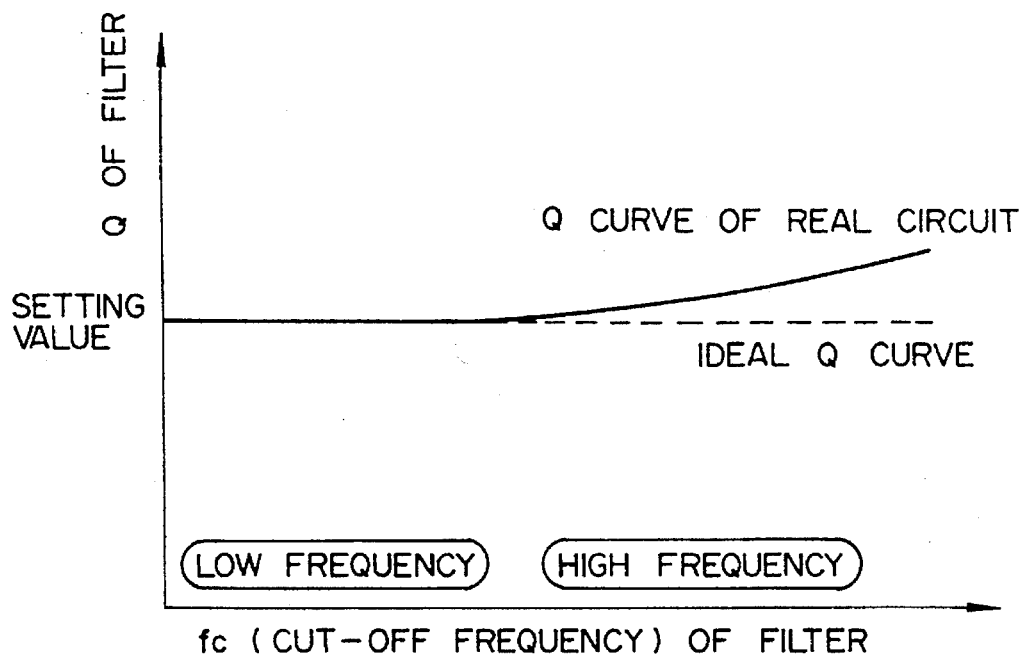
FIG. 3 is a graph showing the relation between Q and cut-off frequency in the conventional active filter.

A first embodiment of the present invention will now be described with reference to FIG. 4.

The present system comprises a microprocessor 1 and an active filter block 100 which includes a register 2, registers 3 and 4 operating similarly to the register 2, DAC's 5, 6 and 7, a Gm control current generator 8, an active filter 9 and a reference current source 10. The register 2 and DAC 5 are adapted to set a cut-off frequency of the active filter 9, and the registers 3 and 4 and DAC's 6 and 7 are adapted to correct the characteristic of the active filter 9.

The active filter 9 includes Gm amplifiers 11 and 12 and capacitors 13 and 14.

The microprocessor 1 writes a set value in each of the registers 2, 3 and 4 in accordance with a cut-off frequency setting table for the active filter 9.

The table will be described later with reference to FIG. 5.

The DAC 5 receives an output current iref of the reference current source 10, amplifies the current at a magnification determined by the setting value of the register 2, and delivers a cut-off frequency control current ifc for the active filter 9.

The Gm control current generator 8 receives the cut-off frequency control current ifc and delivers transconductance currents igm1 and igm2. Each of the transconductance currents igm1 and igm2 is proportional to the cut-off frequency control current ifc, and a ratio determined by the filter characteristic of the active filter 9 is set up between igm1 and igm2.

The Gm control current generator 8 also delivers currents igm3 and igm4, having the same current values as the transconductance currents igm1 and igm2, respectively.

The DAC 6 receives the current igm3 identical to the transconductance control current igm1, amplifies the igm3 at a magnification determined by the setting value of the register 3, and delivers a transconductance correction current is1.

Similarly, the DAC 7 receives the current igm4 identical to the transconductance control current igm2, amplifies the igm4 at a magnification determined by the setting value of the register 4, and delivers a transconductance correction current is2.

Of the Gm amplifiers 11 and 12 constituting the active filter 9, conductance of the former amplifier 11 is controlled by the sum current igm1+is1 resulting from the addition of the transconductance control current igm1 and the transconductance correction current is1, and conductance of the latter amplifier 12 is controlled by the sum current igm2+is2 resulting from the addition of the transconductance control current igm2 and the transconductance correction current is2. Through this, the cut-off frequency and group delay characteristic of the active filter 9 can be controlled ideally even in the high cut-off frequency band.

Accordingly, even when the active filter is constructed of Gm amplifiers which require low power supply voltage and low power consumption, an ideal filter characteristic can be realized in the high frequency band.

Figure 4:
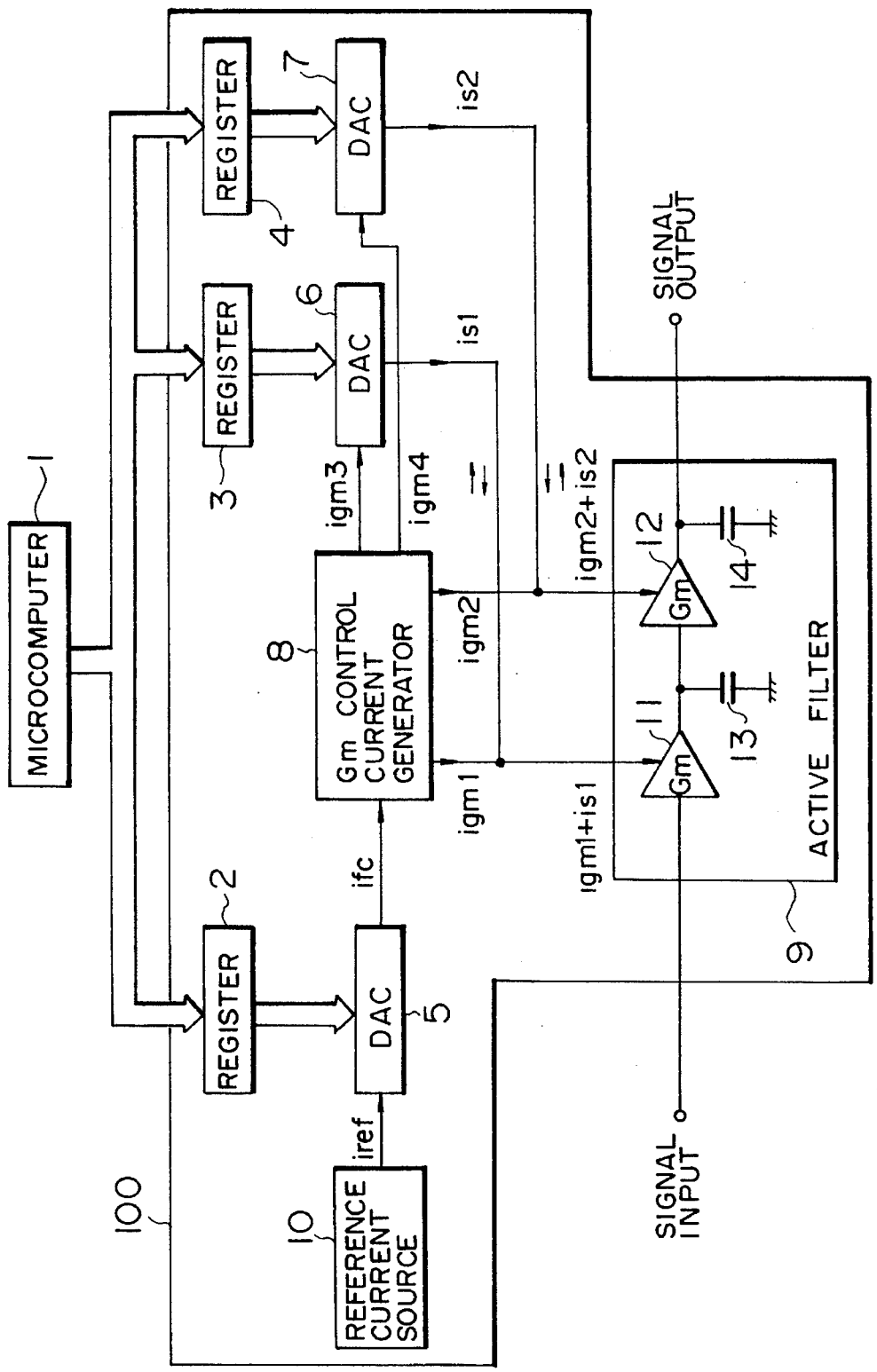
FIG. 4 is a block diagram showing the construction of a first embodiment of the present invention.

FIG. 5 shows an example of the contents of a register setting table for the FIG. 4 system. The zone number will be described later. The setting value of the register 3 (or register 4), for setting of a transconductance correction current, is set to a value which increases as the frequency increases through simulation and evaluation of a real circuit in order that the filter characteristic of the active filter meets an ideal one. Setting values of the registers 3 and 4 are determined by the circuit characteristics.

Figure 6:
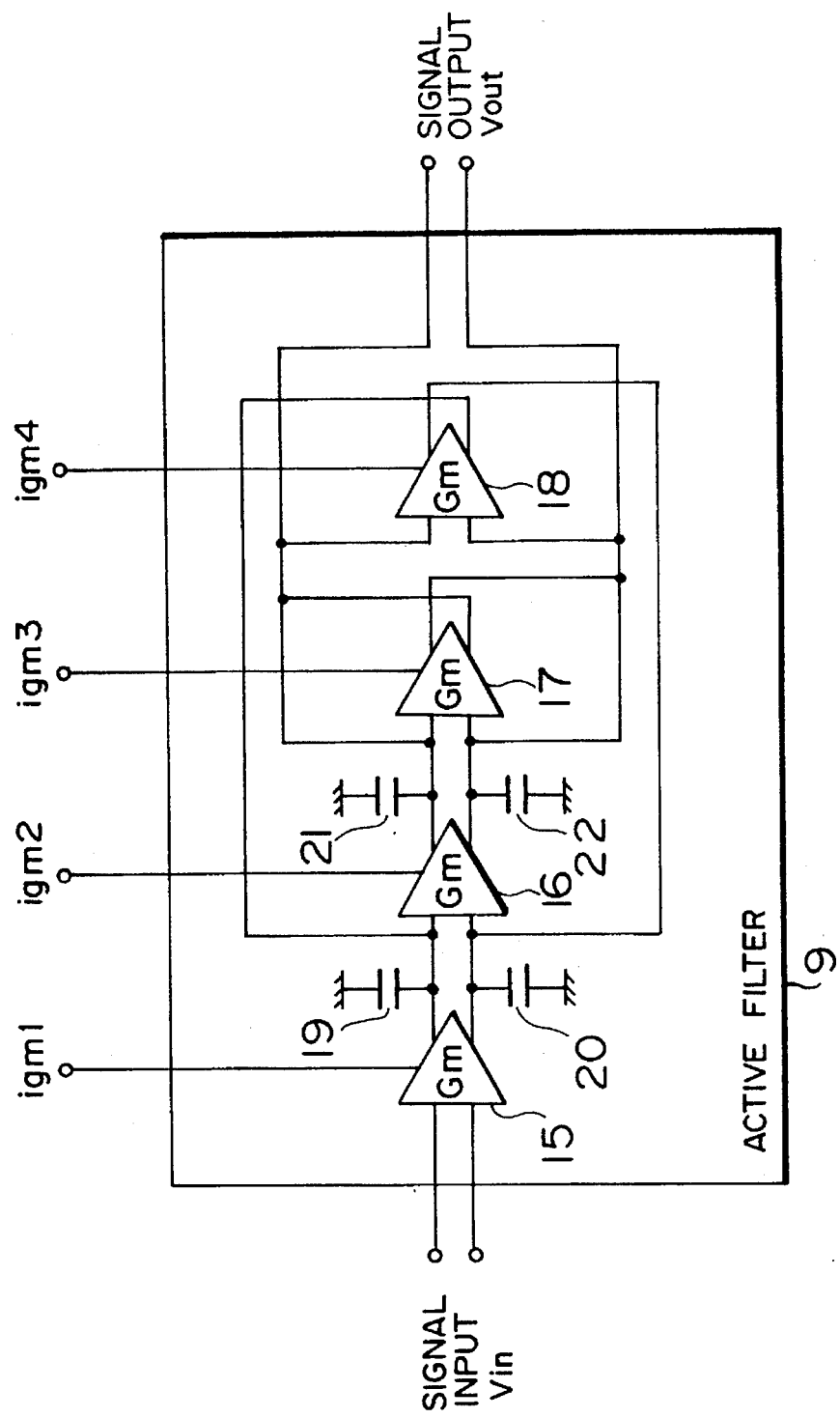
FIG. 6 is a circuit diagram showing the construction of the active filter in FIG. 4.

FIG. 6 shows an example of the construction of the active filter 9 in FIG. 4. In FIG. 6, a second order low-pass filter is exemplified. The active filter 9 includes Gm amplifiers 15, 16, 17 and 18 and capacitors 19, 20, 21 and 22. The Gm amplifier 15 has a conductance of gm1, the Gm amplifier 16 has a conductance of gm2, the Gm amplifier 17 has a conductance of gm3 and the Gm amplifier 18 has a conductance of gm4. The capacitors 19 and 20 have a capacitance of c1 and the capacitors 21 and 22 have a capacitance of c2.

The FIG. 6 second order low-pass filter has a transfer function expressed by equation (1):

$$\frac{Vout}{Vin} = \frac{(\omega O)^2}{S^2 + \frac{\omega O}{Q} S + (\omega O)^2} \qquad (1)$$

where $$\omega O = \sqrt{\frac{gm2 \times gm4}{c1 \times c2}} \qquad (2)$$

and $$Q = \frac{1}{gm4} \sqrt{\frac{c2 \times gm2 \times gm4}{c1}} \qquad (3)$$

By controlling the conductances gm1, gm2, gm3 and gm4 of the Gm amplifiers 15, 16, 17 and 18 with the aid of the transconductance control currents generated by the Gm control current generator 8, •O and Q of the second order low-pass filter can be changed.

Figure 7:
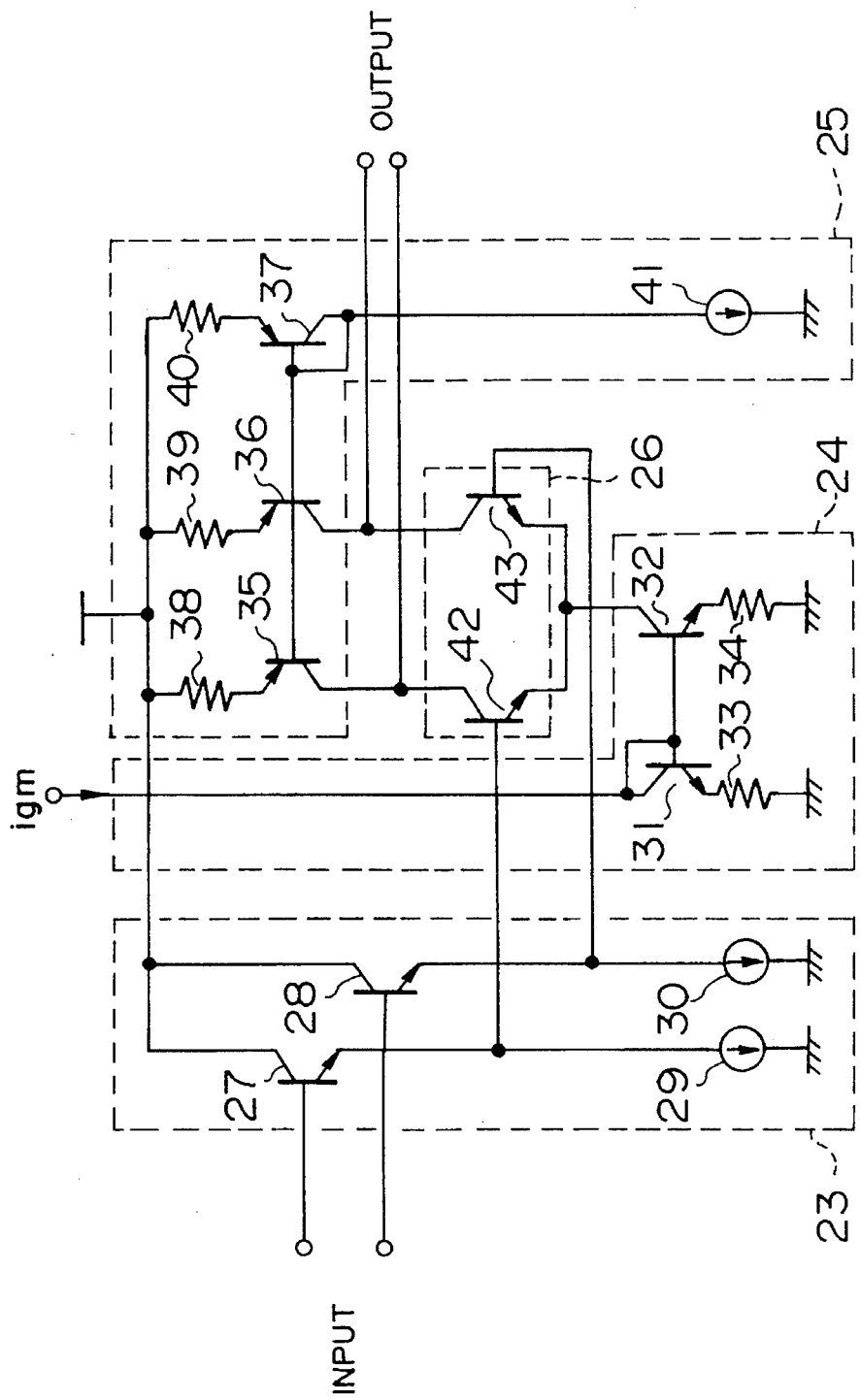
FIG. 7 is a circuit diagram showing the construction of a Gm amplifier in FIG. 4.

FIG. 7 shows an example of construction of the Gm amplifier. The Gm amplifier includes a buffer 23, a current control current source 24, a load current source 25 and a differential amplifier 26. The buffer 23 includes npn bipolar transistors 27 and 28 and current sources 29 and 30. The current control current source 24 includes npn bipolar transistors 31 and 32 and resistors 33 and 34. The current source 25 includes npn bipolar transistors 35, 36 and 37, resistors 38, 39 and 40 and a current source 41. The differential amplifier 26 includes npn bipolar transistors 42 and 43.

The current control current source 24 receives a transconductance control current to control the conductance of the Gm amplifier.

By setting the mirror ratio in the current control current source 24 to 1:1 and setting the emitter size ratio between the npn bipolar transistors 42 and 43 constituting the differential amplifier 26 to 1:1, conductance gm of the Gm amplifier can be expressed by $$gm = \frac{q \times igm}{k \times t} \qquad (4)$$

where k is Boltzmann's constant, T is absolute temperature and q is the electric charge of an electron. Base-emitter bias voltage of the bipolar transistor is required to be about 0.7 to 0.8 volts. Since the circuit of FIG. 7 has three stages, it can be operated by a power supply voltage of 3 to 3.6 volts.

As described above, by adding the transconductance correction currents is1 and is2 complying with the table of FIG. 5 to the transconductance control currents igm1 and igm2 delivered from the Gm control current generator 8 to correct the filter characteristic of the active filter so as to make it ideal, the ideal filter characteristic can be realized in a high cut-off frequency band even when the active filter is constructed of the Gm amplifiers requiring low power supply voltage and low power consumption.

Figure 8:
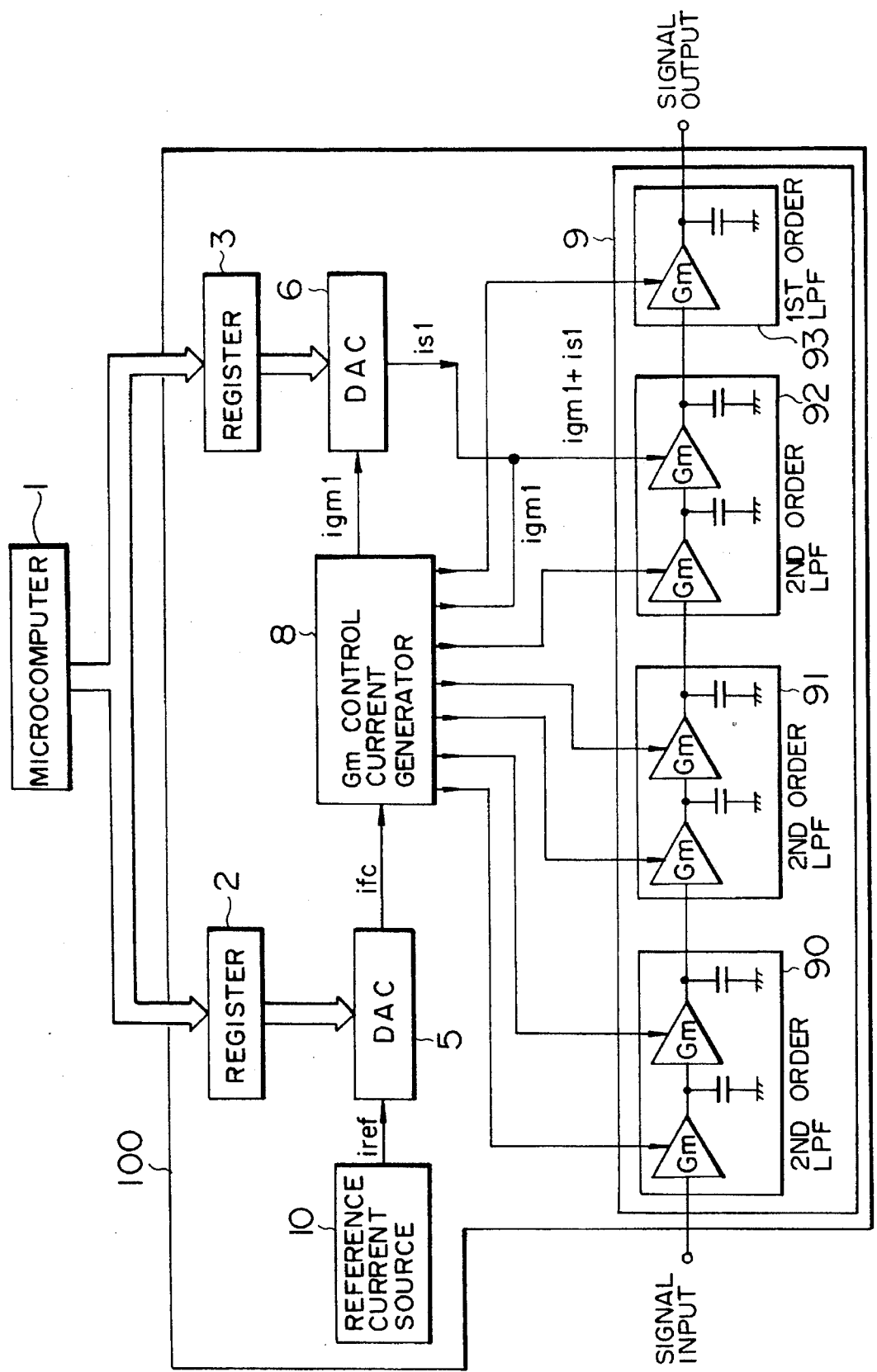
FIG. 8 is a block diagram showing the construction of a modified embodiment of the present invention.

FIG. 8 shows a modified embodiment in which the first embodiment of FIG. 4 is applied to a seventh order low-pass filter (hereinafter referred to as LPF). An active filter 9 is constructed of second order LPF's 90, 91 and 92 and a first order LPF 93. In the magnetic disk, a seventh order 0.05° equiripple LPF is often used by taking into consideration the group delay characteristic which affects noise cut-off characteristics and waveform distortion for a read-out signal. The 0.05° equiripple characteristic is a characteristic in which the group delay characteristic remains constant approximately up to double the cut-off frequency.

When the active filter 9 has the 0.05° equiripple characteristic and the cut-off frequency of the seventh order LPF is set to 15 MHz, the Gm control current generator 8 generates transconductance control currents which allow pole (cut-off) frequencies of the second order LPF's 90, 91 and 92 and first order LPF to be set to 17.21 MHz, 25.77 MHz, 34.76 MHz and 12.92 MHz, respectively, and allow the Q of the second order LPF's 90, 91 and 92 to be set to 0.6810, 1.1143 and 2.0233, respectively. The pole frequency of the second order LPF 92 is the highest in the active filter 9, and its characteristic is liable to be deteriorated. Therefore, with the aim of correcting the characteristic of the second order LPF 92, the DAC 6 receives a current identical to the transconductance control current igm1 for controlling the second order LPF 92 and delivers the transconductance correction current is1 which is amplified in accordance with a value set in the register 3. By controlling the second order LPF 92 by the current resulting from addition of the transconductance correction current is1 to the transconductance control current igm1, the characteristic of the second order LPF can be corrected to thereby correct the characteristic of the active filter 9 constituting the seventh order LPF.

Figure 9:
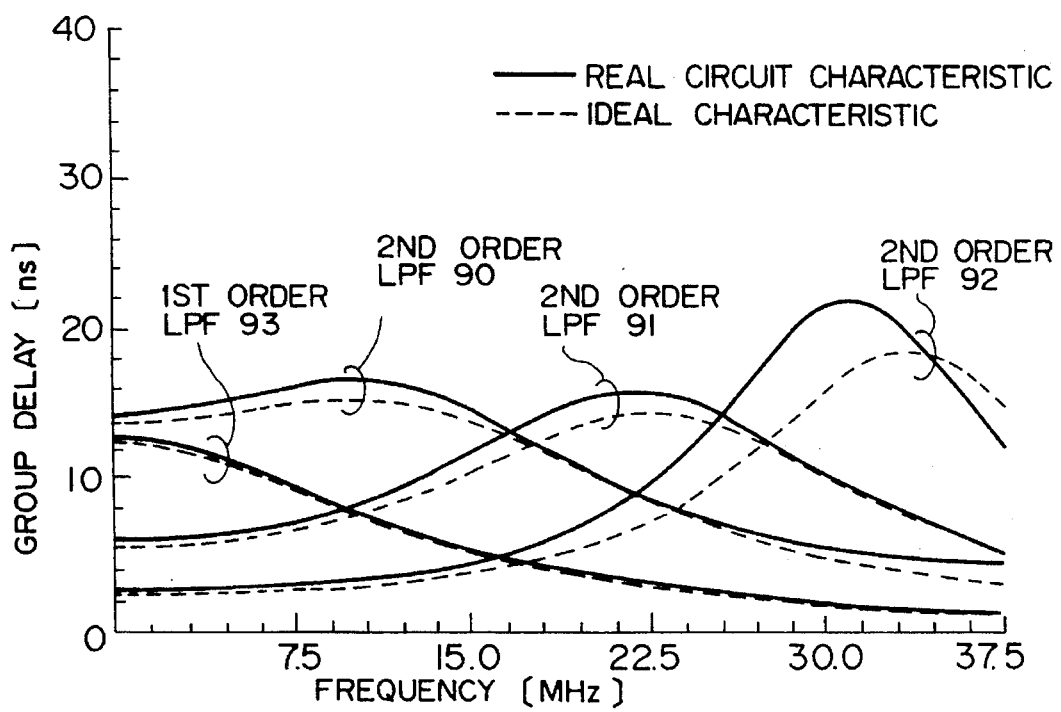
FIG. 9 is a graph showing group delay characteristics of the active filter in FIG. 8 under certain operating conditions.

When the cut-off frequency of the seventh order equiripple LPF 93 shown in FIG. 8 is set to 15 MHz, ideal values of the second order LPF's 90, 91 and 92 and characteristics of a real circuit are obtained as shown in FIG. 9. It will be seen from FIG. 9 that the characteristic of the second order LPF 92 in the form of a real circuit is deteriorated to greatly deviate from the ideal characteristic. The difference is 4 ns at a frequency of 30 MHz. This is due to the fact that the second order LPF 92 decreases in pole frequency and increases in phase rotation, and as a result Q is increased. By correcting the pole frequency and Q of the second order LPF 92, the group delay characteristic can be improved.

Figure 10:
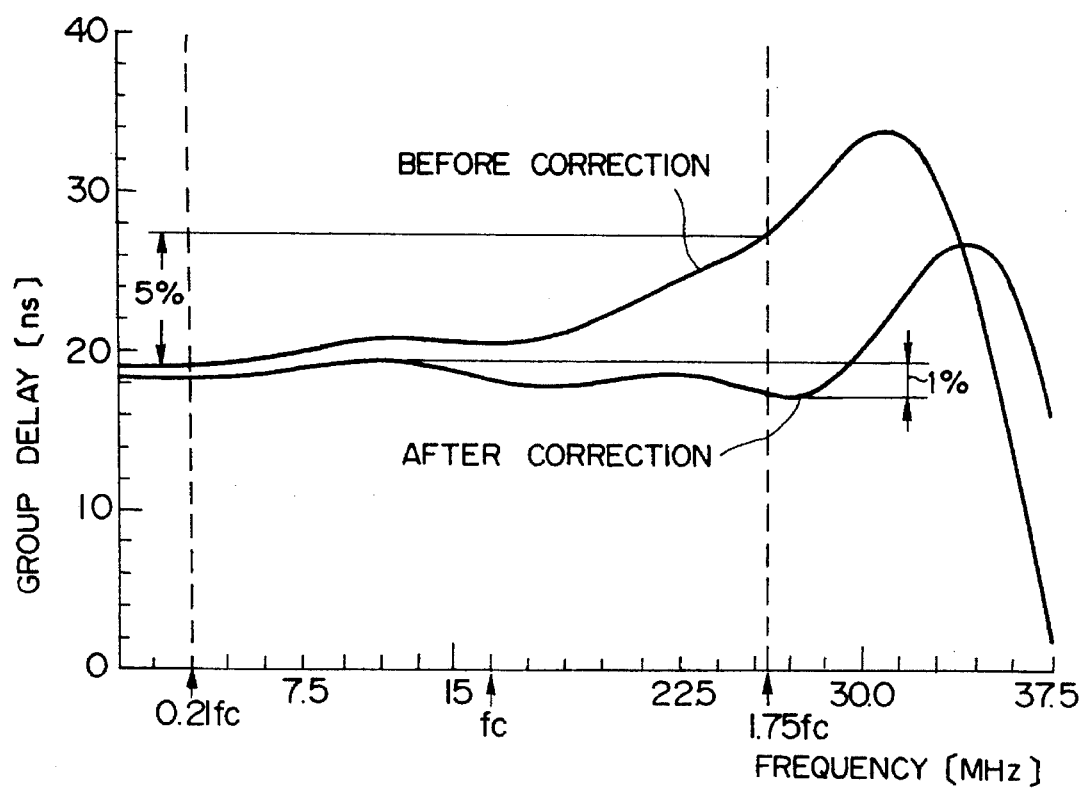
FIG. 10 is a graph showing group delay characteristics of the active filter in FIG. 8 under other operating conditions.

FIG. 10 shows group delay characteristics obtained when the cut-off frequency of the seventh order equiripple LPF shown in FIG. 8 is set to 15 MHz. One of the characteristics shown in FIG. 10 is with correction by the transconductance correction current and the other is without the correction. By generating a transconductance correction current is1 which is 8% of the igm1 by means of the DAC 6 of FIG. 8, the characteristic can be improved to decrease the group delay variation from 5% to 1% within a frequency range of 0.2 to 1.75 times of the cut-off frequency.

Figure 11:
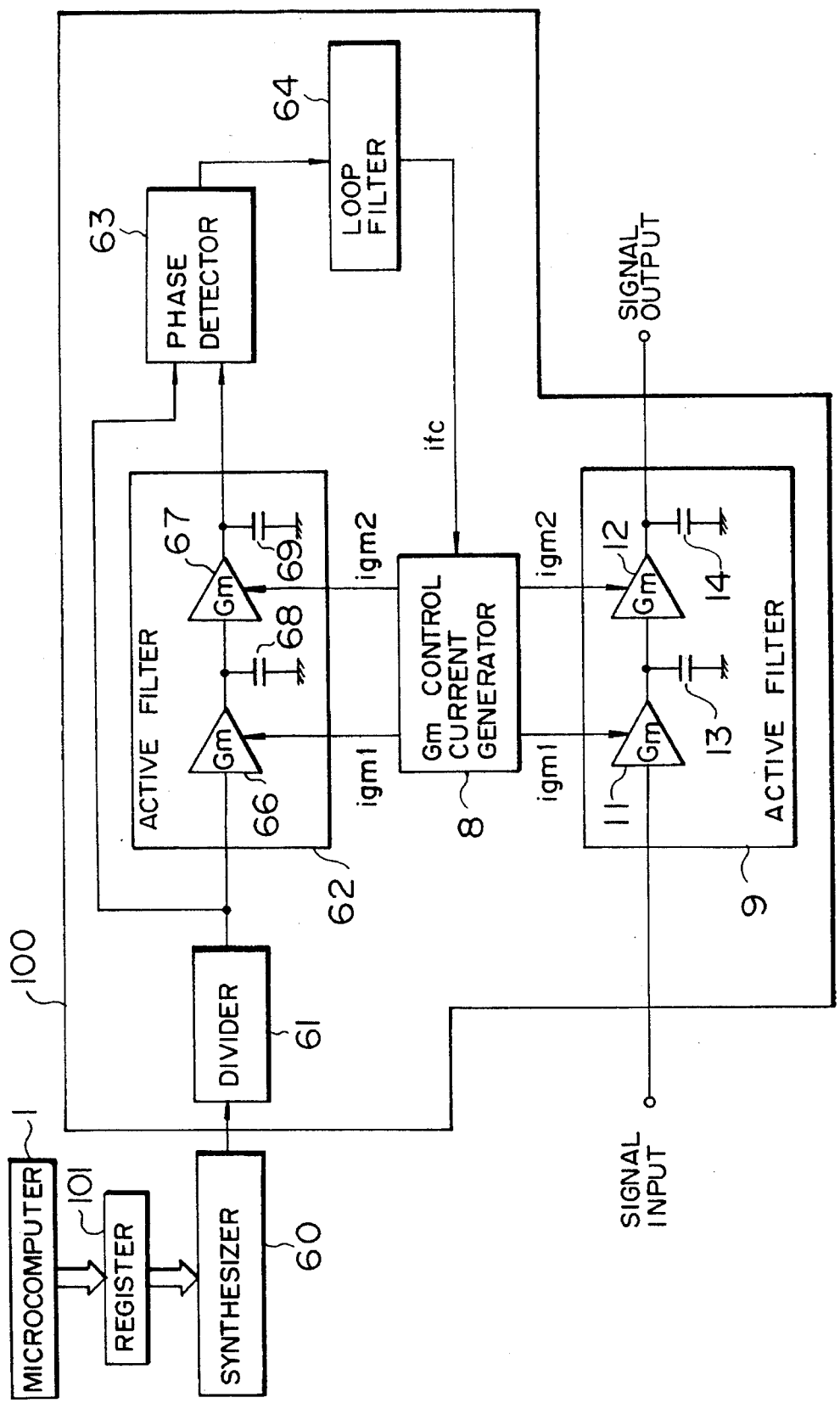
FIG. 11 is a block diagram showing the construction of another embodiment of the present invention.

FIG. 11 is a schematic block diagram showing embodiment of the present invention directed to a control apparatus for automatic correction of the cut-off frequency of the active filter. In FIG. 11, an active filter control apparatus comprises a microprocessor 1, a register 101, a synthesizer 60 and an active filter block 100 which includes a Gm control current generator 8, active filters 9 and 62, a divider 61, a phase detector 63 and a loop filter 64.

The active filter 9 includes Gm amplifiers 11 and 12 and capacitors 13 and 14. The active filter 62 includes Gm amplifiers 66 and 67 and capacitors 68 and 69.

The microprocessor 1 writes a setting value in the register 101 in accordance with an output signal frequency setting table or a setting formula for the synthesizer 60. The synthesizer 60 delivers a signal at a frequency complying with the setting value in the register 101. In the case where the synthesizer 60 is also used for other purposes, the divider 61 divides the output signal of the synthesizer to deliver a signal of a frequency equal to a cut-off frequency of the active filter 62. When the synthesizer 60 is used exclusively for active filter block 100, the divider 61 may be omitted. The active filter 62 receives an output signal of the divider 61 and delivers a signal which is delayed in phase from the input signal. The phase detector 63 receives output signals of the divider 61 and the active filter 62 to deliver a correction signal for making the two signals dephased by 90°. The loop filter 64 receives the output signal of the phase detector 63 and processes the signal in accordance with a loop characteristic to apply a resulting signal to the Gm control current generator 8. The Gm control current generator 8 receives the output of the loop filter 64 and delivers transconductance control signals igm1 and igm2 for controlling conductance of the Gm amplifiers 66 and 67 constituting the active filter 64. Through this operation, the cut-off frequency of the active filter 62 is so controlled as to equal the frequency of the output signal of the divider 61.

At the same time, the Gm control current generator 8 also applies the transconductance control signals igm1 and igm2 to the Gm amplifiers 11 and 12 constituting the active filter 9 to control conductance of the Gm amplifiers 11 and 12.

Through this, the cut-off frequency of the active filter 9 is also controlled so as to equal the frequency of the output signal of the divider 61.

Accordingly, even when a high cut-off frequency is set, the cut-off frequency of the active filter can be set exactly to a preset value without being affected by the pole of the Gm amplifier.

Figure 12:
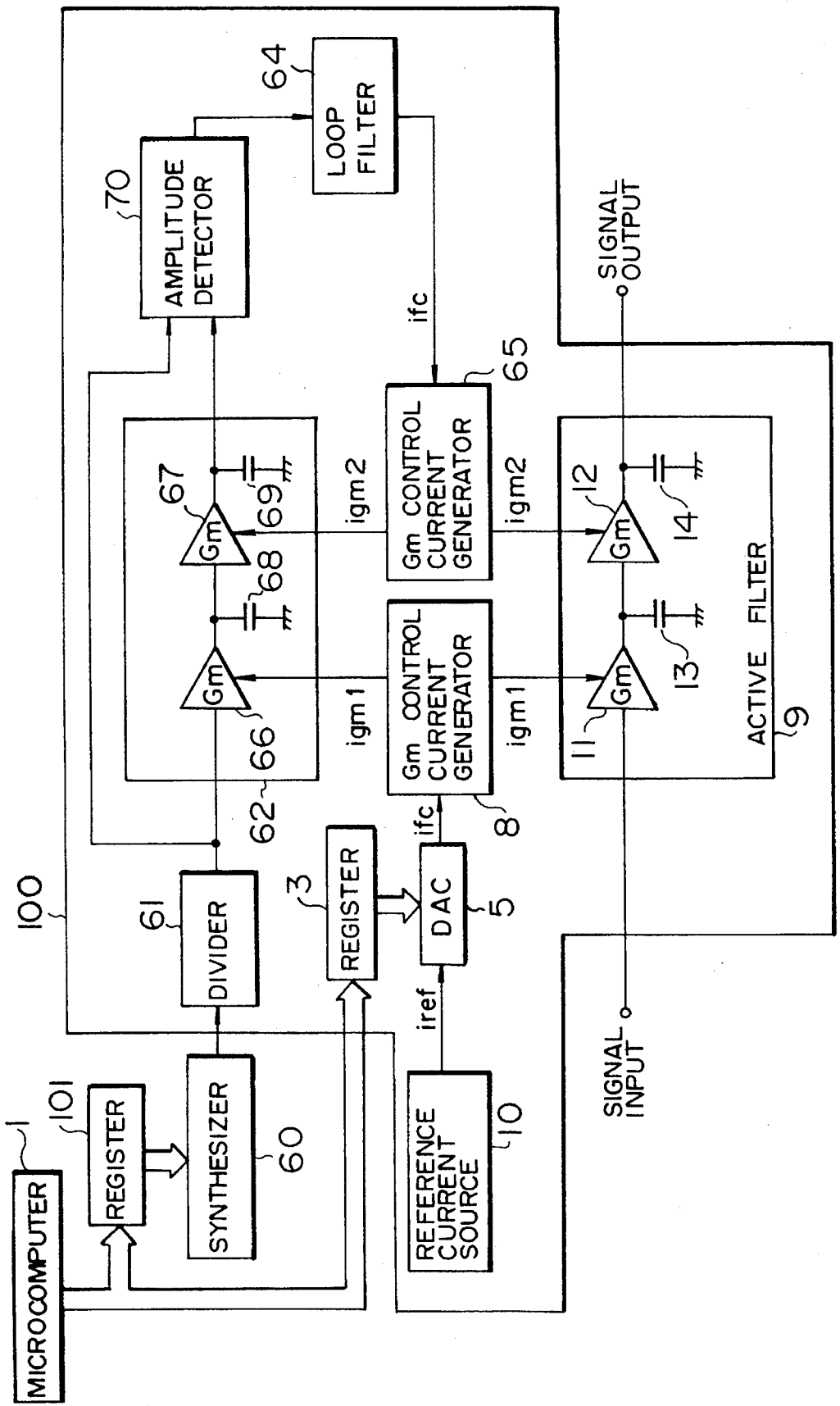
FIG. 12 is a block diagram showing the construction of a further embodiment of the present invention.

FIG. 12 is a schematic block diagram showing a a further embodiment of the present invention directed to a control apparatus for automatic correction of Q.

An active filter control apparatus comprises a microprocessor 1, a register 101, a synthesizer 60 and an active filter block 100 which includes a register 3, a DAC 5, Gm control current generators 8 and 65, active filters 9 and 62, a reference current source 10, a divider 61, a loop filter 64, and an amplitude detector 70.

The active filter 9 includes Gm amplifiers 11 and 12 and capacitors 13 and 14. The active filter 62 includes Gm amplifiers 66 and 67 and capacitors 68 and 69.

The microprocessor 1 writes a setting value in the register 101 in accordance with an output signal frequency setting table or a setting formula for the synthesizer 60. The synthesizer 60 delivers a signal at a frequency complying with the setting value in the register 101. The divider 61 divides the output signal of the synthesizer 60 to deliver a signal of a frequency equal to a cut-off frequency of the active filter 62. The active filter 62 receives the output signal of the divider 61. The amplitude detector 70 receives the output signals of the divider 61 and active filter 62 and compares amplitudes of the two signals to generate a correction signal for providing a desired amplitude ratio which is determined by Q. Reference current source 10, register 3, DAC 5, and Gm control current generator 8 are as in FIG. 4.

The loop filter 64 receives the output signal of the amplitude detector 70 and processes the signal in accordance with a loop characteristic to apply a resulting signal to the Gm control current generator 65. The Gm control current generator 65 receives the output of the loop filter 64 and delivers the transconductance control signal igm2 for controlling conductance of the Gm amplifier 67 within the active filter 62.

Through this operation, the Q of the active filter 62 is so controlled as to have a value determined by the setting of the amplitude detector 70.

At the same time, the Gm control current generator 65 also applies the transconductance control signal igm2 to the Gm amplifier 12 within the active filter 9 to control conductance of the Gm amplifier. Through this, the Q of the active filter 9 is also controlled so as to have a value determined by the setting of the amplitude detector 70.

Accordingly, even when a high cut-off frequency is set, the Q of the active filter can be set exactly to a preset value without being affected by the pole of the Gm amplifier.

Referring now to FIGS. 13, 14A to 14D and 15, an embodiment will be described in which the present invention is applied to a magnetic disk drive apparatus based on the CDR method.

Figure 14A:
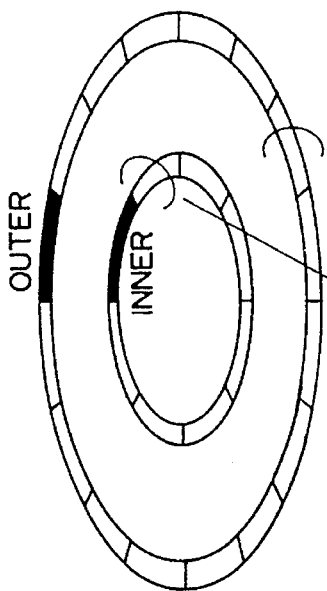
FIGS. 14A and 14B are diagrams for explaining the conventional recording method.
Figure 14C:
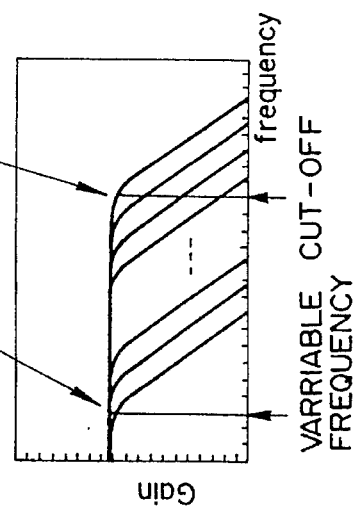
FIGS. 14C and 14D are diagrams for explaining the CDR method.
Figure 14B:
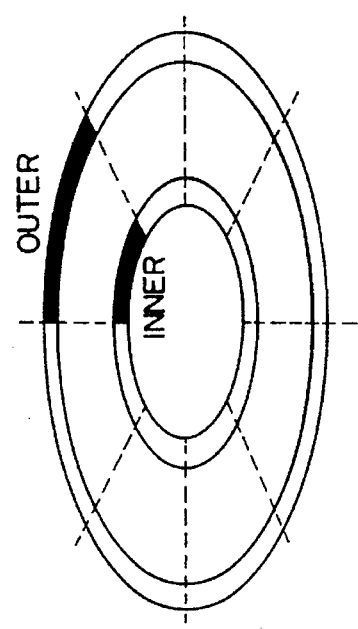
Figure 14D:
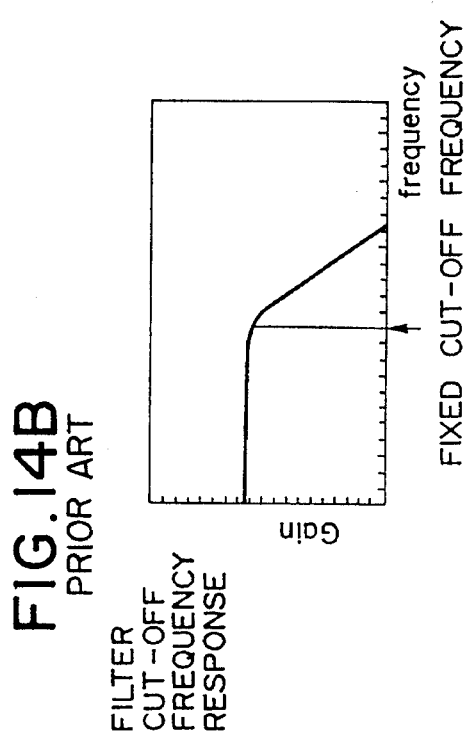

FIGS. 14C and 14D are useful to explain the CDR method. In the conventional method shown in FIG. 14A, recording on a disk is effected at the same transfer rate for inner and outer tracks, with the result that the linear recording density becomes lower as recording proceeds to outer tracks and efficiency of use of capacity is degraded. In the CDR method shown in FIG. 14C, tracks on a magnetic disk are divided into zones, and the transfer rate is made higher for outer zones than for inner zones in order that the linear recording density on the disk can be substantially uniform to increase the recording capacity. Since the frequency of data being recorded changes for an inner track and an outer track in the CDR method, the cut-off frequency of the filter in the block for processing signals upon reading of data is required to be changed so as to have a higher value at an outer track than at an inner track as shown in FIG. 14D, and noise is required to be cut highly efficiently. On the other hand, in the conventional method, the cut-off frequency is constant (FIG. 14B). In the CDR method, the signal frequency is high at outer tracks and therefore, in order to suppress waveform distortion in a read-out waveform at an outer track, accuracy of setting of the cut-off frequency of the filter must be suppressed to 10% or less, and group delay variation must be suppressed to 2 to 3% or less. Through this, error rate as viewed from the whole of the magnetic disk drive apparatus can be improved.

Figure 13:
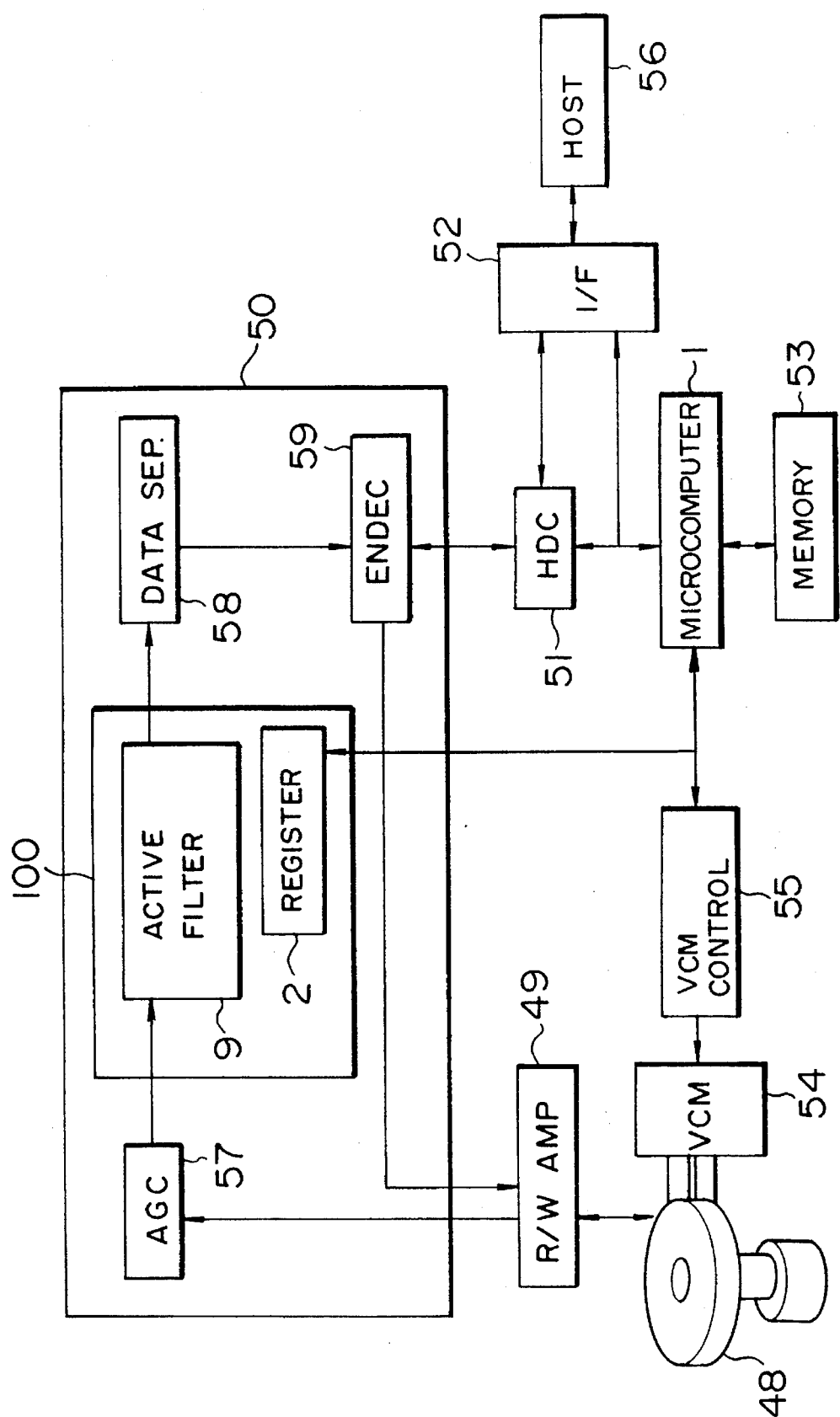
FIG. 13 is a block diagram showing the construction of a system using the present invention.

FIG. 13 is a block diagram showing the construction of a system in which the present invention is applied to a magnetic disk drive apparatus based on the CDR method. The system of FIG. 13 comprises a disk 48 on which data is recorded in accordance with the CDR method, a read/write amplifier 49 for amplifying a signal, a signal processing block 50 for performing signal processing, a hard disk controller (hereinafter simply referred to as HDC) 51 for performing control of data, an interface (hereinafter simply referred to as I/F) 52, a memory 53 for recording, for example, the contents of the register setting table of FIG. 5, a microprocessor 1 for performing control of the HDC 51 and I/F 52, a voice coil motor (hereinafter simply referred to as VCM) 54, a VCM controller 55, and a host 56 for performing processing of data. The signal processing block 50 includes an automatic gain control (hereinafter simply referred to as AGC) amplifier 57 for making the signal amplitude constant, an active filter block 100 for performing noise cut waveform equalization of read-out data, a data separator 58 for generating a clock synchronous with data, and an encoder/decoder (hereinafter simply referred to as ENDEC) 59 for performing coding and decoding of recording codes. The active filter block 100 includes an active filter 9 to be controlled by the present invention and a register 2.

Data recorded on the dick 48 is amplified by the read/write amplifier 49 and applied to the signal processing block 50. A signal inputted to the signal processing block 50 is amplified to a constant amplitude by means of the AGC amplifier 57, subjected to waveform equalization by the active filter 9, and separated into data and a clock by means of the data separator 58, so that data is decoded by the ENDEC 59 and sent to the HDC 51. At that time, the microprocessor 1 decides a zone on which data being read is recorded and sets a cut-off frequency of the active filter 9 and a setting value of the register 2 for control of Q.

Figure 15:
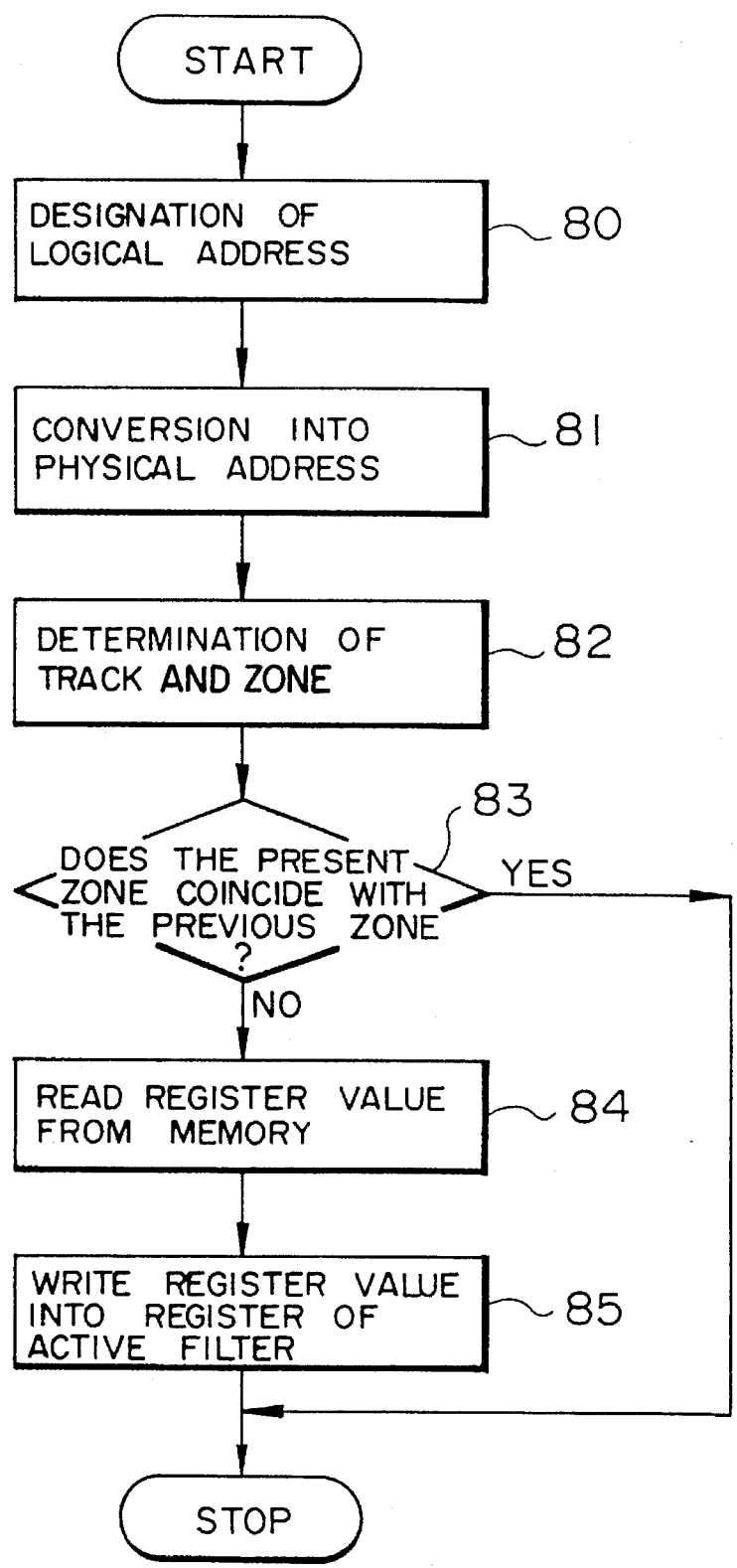
FIG. 15 is a flow chart of a register setting process in the active filter.

FIG. 15 is a flow chart for register setting upon data read when the present invention is used in the magnetic disk drive system. The flow chart of FIG. 15 will be described by referring to the system construction diagram of FIG. 13. Firstly, the host 56 designates a logical address of data to be read to the microprocessor 1 through I/F 52 (step 80). The microprocessor 1 processes the designated logical address to convert it into a physical address (step 81). A track number and a zone number on the disk 48 are determined from the physical address (step 82). If the present zone differs from the previously accessed zone (step 83), the microprocessor 1 reads a register setting value corresponding to the zone number by referring to the register setting table of FIG. 5 stored in the memory 53 (step 84). The microprocessor 1 writes the register value read out of the memory 53 into the register 2 included in the active filter block 100 (step 85). If the present zone coincides with the previously accessed zone in step 83, the register value is not rewritten and remains the previous setting value.

Through the construction and operation as above, the cut-off frequency and Q of the active filter can be controlled in compliance with a data transfer rate for each zone on the disk, and the group delay characteristic can also be controlled. In this manner, reduction in operation voltage in the signal processing LSI can be ensured, and reduction in power consumption in the magnetic disk drive apparatus can be permitted.

The active filter block 100 operable at a low voltage of 3 to 3.6 volts can be constructed, and therefore, the signal processing block 50 can easily be realized with one chip LSI to advantage.

We claim:

1. An active filter control apparatus for controlling an active filter having a variable cut-off frequency, said active filter control apparatus comprising:

means responsive to a control signal for tuning the cut-off frequency of the active filter; and characteristic correction means coupled to said turning means and responsive to the control signal signal for generating a correction signal to correct a group delay characteristic of the active filter in accordance with a set cut-off frequency, wherein:

said characteristic correction means includes correction signal generator means for generating the correction signal in accordance with a set correction amount from the control signal, and said cut-off frequency tuning means controls the characteristic of the active filter by using the correction signal.

2. An active filter control apparatus according to claim 1, wherein said apparatus operates at a power supply voltage of 3 to 3.6 volts.

3. An active filter control apparatus according to claim 1, wherein said apparatus is formed of a one-chip LSI integrated on one chip.

4. In a recording/reproducing apparatus having a variable recording/reproducing speed and including an active filter having a variable cut-off frequency, the improvement comprising an active filter control apparatus including:

means responsive to a control signal for tuning the cut-off frequency of the active filter; and characteristic correction means coupled to said tuning means and responsive to the control signal for generating a correction signal to correct a group delay characteristic of the active filter in accordance with a set cut-off frequency, wherein:

said characteristic correction means includes correction signal generator means for generating the correction signal in accordance with a set correction amount from the control signal, and said cut-off frequency tuning means controls the characteristic of the active filter by using the correction signal.

5. A reproducing apparatus having different data reproduction speeds for different zones on a recording medium, comprising:

a filter having a variable cut-off frequency, for processing read-out signals;

a microprocessor operative to control the cut-off frequency of said filter in accordance with a table of correction factors for correcting a group delay characteristic of said filter, so as to control the group delay characteristic or said filter, said table being set in accordance with a zone of read-out data, correction signal generator means coupled to said microprocessor for generating a correction signal to correct the group delay characteristic in accordance with a set correction amount from the table; and cut-off frequency tuning means for controlling the characteristic of said filter by using the correction signal.

6. A reproducing apparatus according to claim 5, further comprising a register storing the correction factors.

7. A reproducing apparatus according to claim 5, further comprising a memory for storing the correction factors.

8. An active filter control apparatus according to claim 1, wherein said characteristic correcting means includes a register for storing the set correction amount.

9. An active filter apparatus comprising:

an active filter device having a variable cut-off frequency;

means responsive to a control signal for tuning the cut-off frequency of said active filter device;

characteristic correction means coupled to said tuning means and responsive to the control signal for generating a correction signal to correct a group delay characteristic of said active filter device in accordance with a set cut-off frequency, wherein:

said characteristic correction means includes correction signal generator means for generating the correction signal in accordance with a set correction amount from the control signal, and said cut-off frequency tuning means controls the characteristic of the active filter device by using the correction signal.

10. An active filter apparatus according to claim 9, wherein said apparatus operates at a power supply voltage of 3 to 3.6 volts.

11. An active filter apparatus according to claim 9, wherein said apparatus is formed of a one-chip LSI integrated on one chip.

12. An active filter apparatus according to claim 9, wherein said characteristic correction means includes a register for storing the set correction amount.

* * * * *